(12) United States Patent
    Kikuchi

(10) Patent No.: US 12,607,680 B2
(45) Date of Patent: Apr. 21, 2026

(54) BATTERY DIAGNOSIS APPARATUS

(71) Applicant: SUBARU CORPORATION, Tokyo (JP)

(72) Inventor: Jun Kikuchi, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 385 days.

(21) Appl. No.: 18/450,725

(22) Filed: Aug. 16, 2023

(65) Prior Publication Data

US 2024/0069113 A1 Feb. 29, 2024

(30) Foreign Application Priority Data

Aug. 30, 2022 (JP) ................................. 2022-136951

(51) Int. Cl.
| | |
|---|---|
| *G01R 31/3835* | (2019.01) |
| *B60L 58/16* | (2019.01) |
| *H02J 7/80* | (2026.01) |

(52) U.S. Cl.
CPC .......... *G01R 31/3835* (2019.01); *B60L 58/16* (2019.02); *H02J 7/80* (2026.01); *B60L 2250/00* (2013.01)

(58) Field of Classification Search
CPC .......... G01R 31/3835; G01R 19/16542; G01R 31/386; G01R 31/392; B60L 58/16; B60L 2250/00; B60L 3/0046; B60L 3/12; B60L 58/10; B60L 58/12; H02J 7/0047
See application file for complete search history.

(56) References Cited

U.S. PATENT DOCUMENTS

| | | | | |
|---|---|---|---|---|
| 11,296,366 | B2 * | 4/2022 | Lee ..................... | G01R 31/3842 |
| 2013/0132011 | A1 * | 5/2013 | Mano .................. | H01M 10/441 |
| | | | | 702/63 |
| 2021/0218262 | A1 * | 7/2021 | Bae ....................... | H02J 7/0013 |
| 2022/0131400 | A1 * | 4/2022 | Nakao .................... | B60L 58/12 |
| 2023/0025686 | A1 * | 1/2023 | Okabe ................. | H02J 7/00714 |
| 2024/0069115 | A1 * | 2/2024 | Tsumoto ............. | H01M 10/486 |

FOREIGN PATENT DOCUMENTS

WO 2011/145213 A1 11/2011

* cited by examiner

*Primary Examiner* — Manuel A Rivera Vargas
(74) *Attorney, Agent, or Firm* — Rimon P.C.

(57) ABSTRACT

A battery diagnosis apparatus is configured to perform a diagnosis process that determines whether a battery mounted on an electric vehicle is a normal product. The battery diagnosis apparatus includes a battery control unit. The battery control unit is configured to diagnose that the battery is not the normal product when one of the following conditions is satisfied: a voltage of the battery decreases to a lower limit voltage before a predetermined time elapses from a start of discharging of a current having a predetermined current value from the battery; and an output value from the battery during a period from the start of the discharging until the elapse of the predetermined time is equal to or less than a predetermined ratio of an output value to be outputted from a genuine, new battery during the period from the start of the discharging until the elapse of the predetermined time.

8 Claims, 4 Drawing Sheets

BATTERY DIAGNOSIS APPARATUS

CROSS-REFERENCE TO RELATED APPLICATIONS

The present application claims priority from Japanese Patent Application No. 2022-136951 filed on Aug. 30, 2022, the entire contents of which are hereby incorporated by reference.

BACKGROUND

The disclosure relates to a battery diagnosis apparatus.

Various devices and diagnosis methods have been developed that diagnose a deterioration of a battery mounted on a battery-based vehicle, such as a plug-in hybrid vehicle or an electric vehicle (EV).

For example, International Publication No. 2011/145213 discloses a technique related to a diagnosis apparatus or a diagnosis method that determines a deterioration of a battery, or diagnoses whether the battery is, for example, new, usable, or unusable, based on an amount of electric charge discharged by the battery until a voltage of the battery decreases from a first voltage to a second voltage that is lower than the first voltage.

SUMMARY

An aspect of the disclosure provides a battery diagnosis apparatus configured to perform a diagnosis process that determines whether a battery mounted on an electric vehicle is a normal product. The battery diagnosis apparatus includes a battery control unit. The battery control unit is configured to diagnose that the battery is not the normal product when one of the following conditions is satisfied: a voltage of the battery decreases to a lower limit voltage before a predetermined time elapses from a start of discharging of a current having a predetermined current value from the battery; and an output value from the battery during a period from the start of the discharging until the elapse of the predetermined time, from the battery is equal to or less than a predetermined ratio of an output value to be outputted from a genuine, new battery during the period from the start of the discharging until the elapse of the predetermined time.

An aspect of the disclosure provides a battery diagnosis apparatus configured to perform a diagnosis process that determines whether a battery mounted on an electric vehicle is a normal product. The battery diagnosis apparatus includes circuitry. The circuitry is configured to diagnose that the battery is not the normal product when one of the following conditions is satisfied: a voltage of the battery decreases to a lower limit voltage before a predetermined time elapses from a start of discharging of a current having a predetermined current value from the battery; and an output value from the battery during a period from the start of the discharging until the elapse of the predetermined time, from the battery is equal to or less than a predetermined ratio of an output value to be outputted from a genuine, new battery during the period from the start of the discharging until the elapse of the predetermined time.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
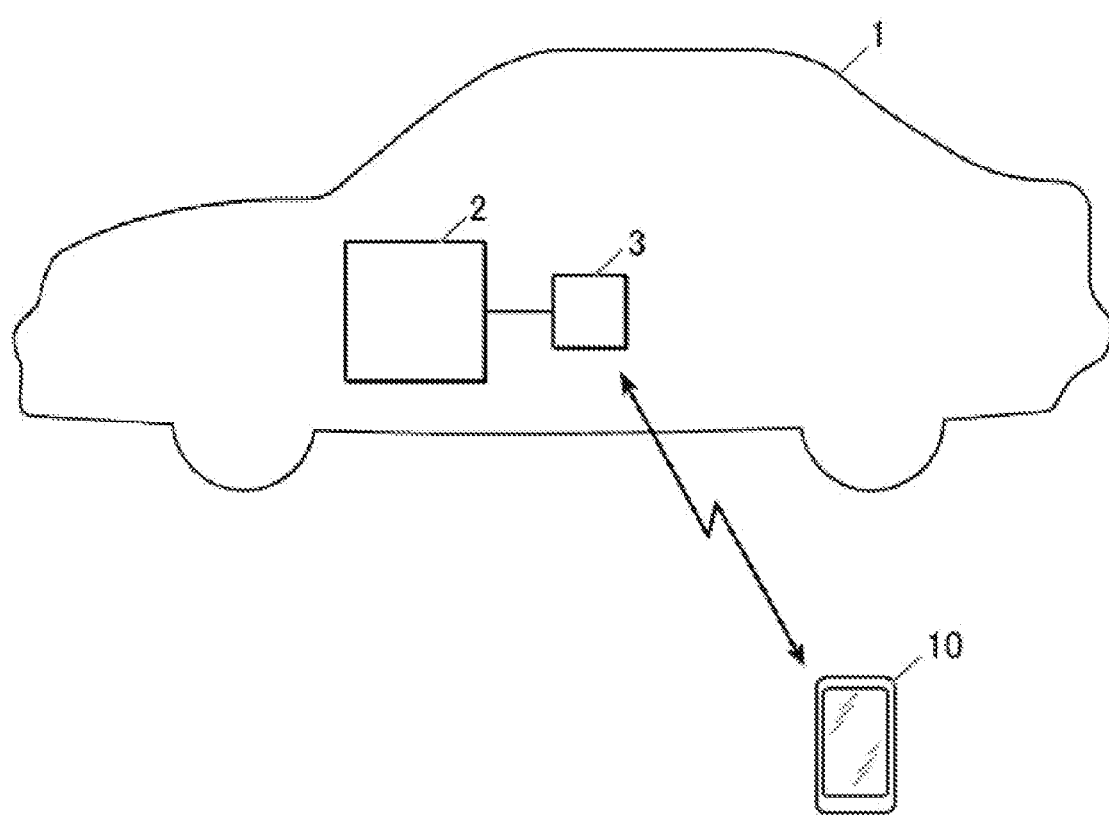
FIG. 1 is a schematic diagram illustrating a battery and a battery diagnosis apparatus mounted on an electric vehicle according to one example embodiment of the disclosure.

An operation such as a diagnosis of a deterioration of a battery, such as that disclosed in International Publication No. 2011/145213, is based on an assumption that the diagnosis is performed where the battery is a genuine product, that is, where the battery is provided by an authorized dealer.

Accordingly, when a user replaces the battery of an electric vehicle by any dealer other than the authorized dealer, the battery can be replaced by a non-genuine battery. Even when the deterioration of the battery is diagnosed by the above-described diagnosis method with respect to the non-genuine battery, it is difficult to know whether an obtained diagnosis result is reliable.

If the battery is the genuine product, a label of the battery is usually managed. Accordingly, it is possible to know whether the battery is the genuine product by checking the label through, for example, opening a package of the battery. However, once the battery is mounted on the electric vehicle, it is necessary to bring the electric vehicle to a dealer or to open the package using a tool in order to open the package with the battery being mounted on the electric vehicle, which is often not easily performable.

Even when the user replaces the battery with the genuine battery by any dealer other than the authorized dealer, the battery can be an aged battery rather than a new battery. In this case, it is difficult to know whether a normal control is accurately performable even when the normal control is performed on the aged genuine battery.

It is desirable to provide a battery diagnosis apparatus that makes it possible to diagnose whether a battery is a normal product with the battery being mounted on an electric vehicle.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings.

In the following example embodiment, a battery that is a genuine and an aging deterioration is not advanced is referred to as normal or a normal product. Further, in the following example embodiment, a battery that is a non-genuine product or a battery that is aged even when the battery is genuine is referred to as not normal or not the normal product.

In an example embodiment, the electric vehicle 1 may be any battery-based vehicle such as a plug-in hybrid vehicle or an EV (Electric Vehicle). Referring to FIG. 1, the electric vehicle 1 includes a battery 2.

The battery 2 may be coupled to a battery control unit (BCU) 3 that controls an operation such as discharging from the battery 2 or charging of the battery 2. The BCU 3 may be or may include a microprocessor having a device such as a central processing unit (CPU).

In the example embodiment, a battery diagnosis apparatus may be configured by the BCU 3.

In one embodiment, the BCU 3 may serve as the "battery diagnosis apparatus". In the following, the BCU 3 may be referred to as a battery diagnosis apparatus 3. In some embodiments, the battery diagnosis apparatus may be a device that is separate from the BCU 3.

In some embodiments, the battery diagnosis apparatus 3 may be configured to communicate with a portable terminal 10, such as a smartphone, carried by a user.

The battery diagnosis apparatus 3 performs a diagnosis process that determines whether the battery 2 mounted on the electric vehicle 1 is the normal product, with the battery 2 being mounted on the electric vehicle 1.

Hereinafter, the diagnosis process to be performed by the battery diagnosis apparatus 3 will be described. It is to be also noted that workings and example effects of the battery diagnosis apparatus 3 according to the example embodiment will be described.

The battery diagnosis apparatus 3 may discharge a current I having a predetermined current value from the battery 2, and perform the diagnosis process that diagnoses whether the battery 2 is the normal product, based on a voltage V and an output value O of the battery 2 upon the discharging of the current I. For example, the predetermined current value may be 100 [A].

Before the diagnosis process to be performed by the battery diagnosis apparatus 3 is described in detail, a limitation on the output value O set for the genuine battery 2 will be described.

For example, a relationship between the output value O and the voltage V and between the output value O and the current I is as illustrated in Expression (1) below.

$$O = \int V \times I dt \quad (1)$$

That is, the output value O may be calculated by a time integration of the product of the voltage V and the current I as illustrated in the above Expression (1).

Figure 2:
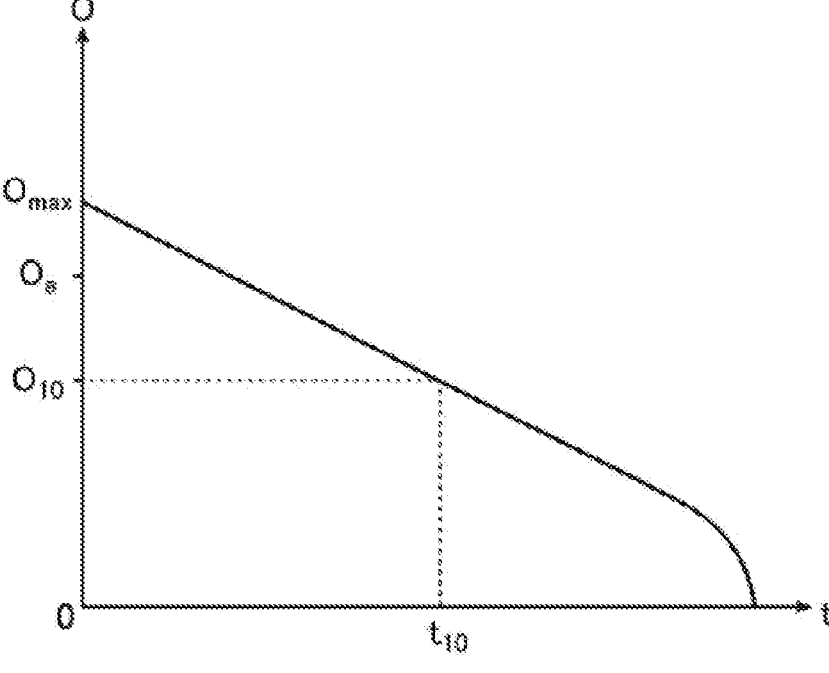
FIG. 2 is a graph illustrating that an output value of the battery decreases as time elapses.

When the battery 2 ages, the output value O of the battery 2 may usually decrease as time t elapses from a new state (t=0) as illustrated in FIG. 2.

Accordingly, in anticipation of the use of the electric vehicle 1 for 10 years, for example, an output value O10 obtainable from the battery 2, where the battery 2 is used for 10 years (refer to t10 in FIG. 2) in a normal use condition from the start of use of the battery 2, may be assumed in advance.

In this connection, there may be some cases where the BCU 3 is configured to so control the battery 2 that the output value O from the battery 2 is limited to provide an output up to O10 at the maximum from the time when the battery 2 is new, i.e., from the start of use of the battery 2.

Accordingly, there may be some cases where the BCU 3 so controls the battery 2 as to suppress the output from the battery 2 such that the same control method is applicable to the battery 2 for at least 10 years in anticipation of the aging of the battery 2.

However, under such circumstances where the limit is imposed on the output from the battery 2, it is difficult to diagnose whether the battery 2 is the normal product.

Accordingly, in some embodiments, the battery diagnosis apparatus 3 may release the limit when the limit is imposed on the output value O of the battery 2, and subject the battery 2 to the discharging at an output value Oa (see FIG. 2) that is higher than the limit to performs the diagnosis process on the battery 2.

Thus discharging the battery 2 at the higher output value Oa as described above may cause a difference in a way in which, for example, the voltage V of the battery 2 changes depending on, for example, whether the battery 2 is the genuine product or the non-genuine product, which makes it easier to diagnose whether the battery 2 is the normal product.

On the other hand, for example, discharging the battery 2 at the maximum value Omax of the output value O obtainable from the battery 2 can cause excessive electric power to be supplied to each device in the electric vehicle 1 each of which is to be supplied with the electric power from the battery 2, which can cause a malfunction of each of the devices.

Accordingly, in some embodiments, the output value Oa higher than the limit to be outputted in the above-described example case may be set in advance to an upper limit, or an output value slightly smaller than the upper limit, of an output value that falls within a range in which the malfunction does not occur or hardly occurs in one or more of the devices to each of which the electric power is to be supplied from the battery 2.

It is to be noted that when it is possible to diagnose whether the battery 2 is the normal product without setting the output value Oa of the battery 2 to the upper limit, or the output value slightly smaller than the upper limit, of the output value that falls within the range in which the malfunction does not occur or hardly occurs in one or more of the devices to each of which the electric power is to be supplied from the battery 2, the output value Oa of the battery 2 upon performing the diagnosis process may be set to any value.

Figure 3A:
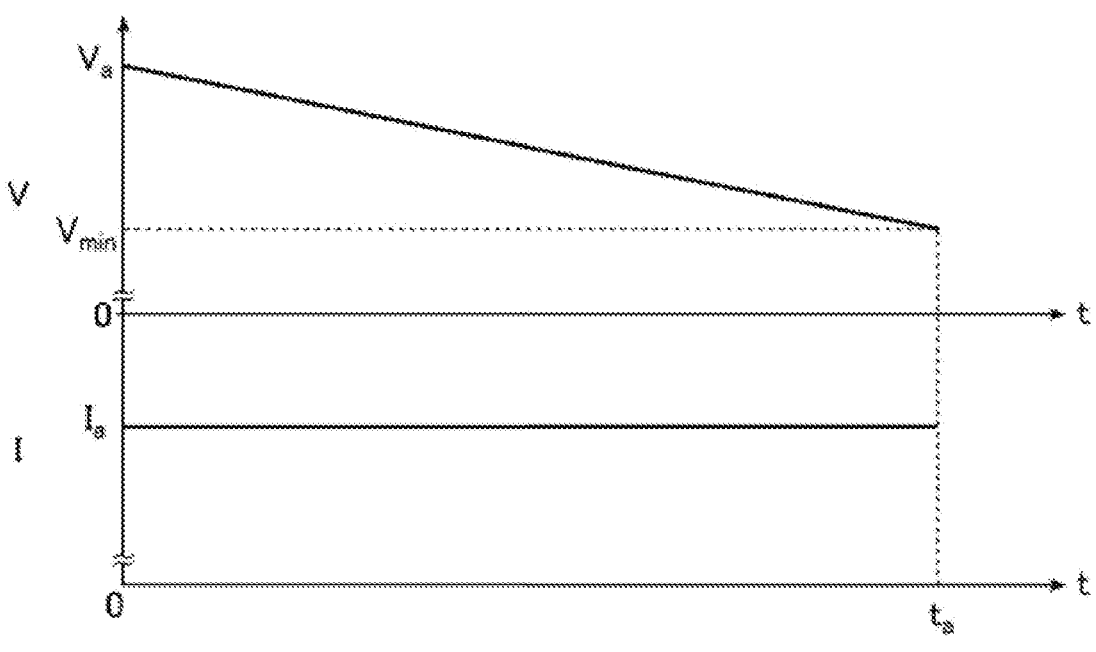
FIG. 3A is a graph illustrating that a voltage of a genuine battery decreases when discharging is started.

For example, when the discharging of the current I having the predetermined current value (e.g., 100 [A]) from the battery 2 is started with the limit being released as described above, the voltage V of the battery 2 may gradually decrease as illustrated in FIG. 3A if the battery 2 is the genuine, new product.

That is, if the battery 2 is the genuine, new product, the voltage V of the battery 2 may so decrease that the voltage V of the battery 2 becomes a lower limit voltage Vmin or a voltage close to the lower limit voltage Vmin from an initial value Va at a time point when a predetermined time ta has elapsed. For example, the predetermined time ta may be 120 seconds.

The initial value Va of the voltage V of the battery 2 may be set in advance as a value at which the output value O from the battery 2 becomes an output value Oa. The output value Oa may be calculated as the hatched area in FIG. 3B.

In some embodiments, where the battery 2 is the genuine, new product, the predetermined time ta may be set in advance as a time during which the voltage V of the battery 2 decreases from the predetermined initial value Va to a first voltage when the current is discharged from the battery 2 at a predetermined current value Ia. In some embodiments, the first voltage may be a voltage that is closer to the lower limit voltage Vmin than an intermediate voltage. For example, the intermediate voltage may be a voltage when a state of charge (SOC) of the genuine, new battery 2 is 30%. In some embodiments, the first voltage may be a voltage equal to or higher than the lower limit voltage Vmin. This configuration allows, where the battery 2 is the genuine, new product, the predetermined time ta to become a period during which the voltage V of the battery 2 decreases from the predetermined initial value Va to the lower limit voltage Vmin or the voltage close to the lower limit voltage Vmin upon discharging of the current from the battery 2 at the predetermined current value Ia, which makes it easier to diagnose whether the battery 2 is the normal product.

In contrast, when the non-genuine battery 2 is discharged under the above-described conditions, i.e., discharged at the initial value Va of the above-described voltage or the current value Ia set for the genuine, new battery 2, the voltage of the battery 2 can decrease to the lower limit voltage Vmin of the battery 2 before the predetermined time ta elapses.

Figure 4:
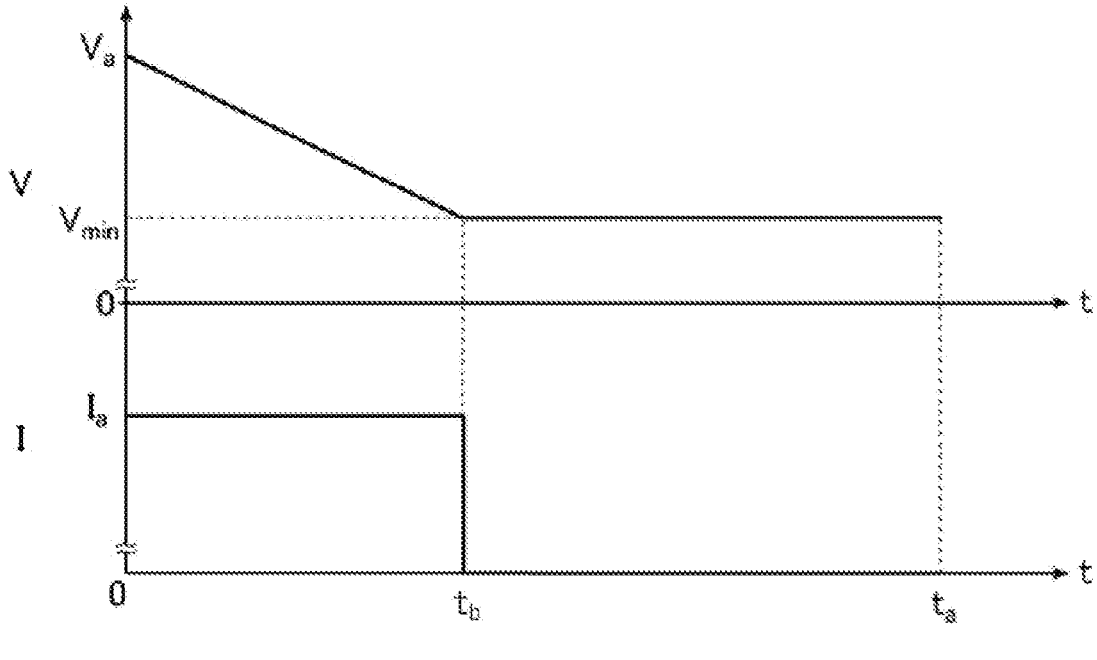
FIG. 4 is a graph illustrating a state in which a voltage decreases to a lower limit voltage before a predetermined period "ta" elapses when a non-genuine battery is discharged.

For example, as illustrated by way of example in FIG. 4, the voltage V of the battery 2 can decrease to the lower limit voltage Vmin before the predetermined period ta elapses from the start of discharging, and the current value Ia outputted from the battery 2 at the time in which the voltage V has decreased to the lower limit voltage Vmin (see tb in FIG. 4) can become 0 (zero). One reason that the current value Ia becomes 0 may be due to a control adapted to protect the battery 2.

It should be noted that, even when the battery 2 is the genuine product, the voltage can decrease to the lower limit voltage Vmin before the predetermined period ta elapses due to the discharging described above if the aging is progressed.

Accordingly, the battery diagnosis apparatus 3 diagnoses that the battery 2 mounted on the electric vehicle 1 is not the normal product, when the voltage V of the battery 2 decreases to the lower limit voltage Vmin before the predetermined period ta elapses from the start of discharging.

It should be also noted that some non-genuine batteries 2 do not involve the decrease in the voltage V of the battery 2 to the lower limit voltage Vmin until the predetermined period ta elapses.

Figure 5A:
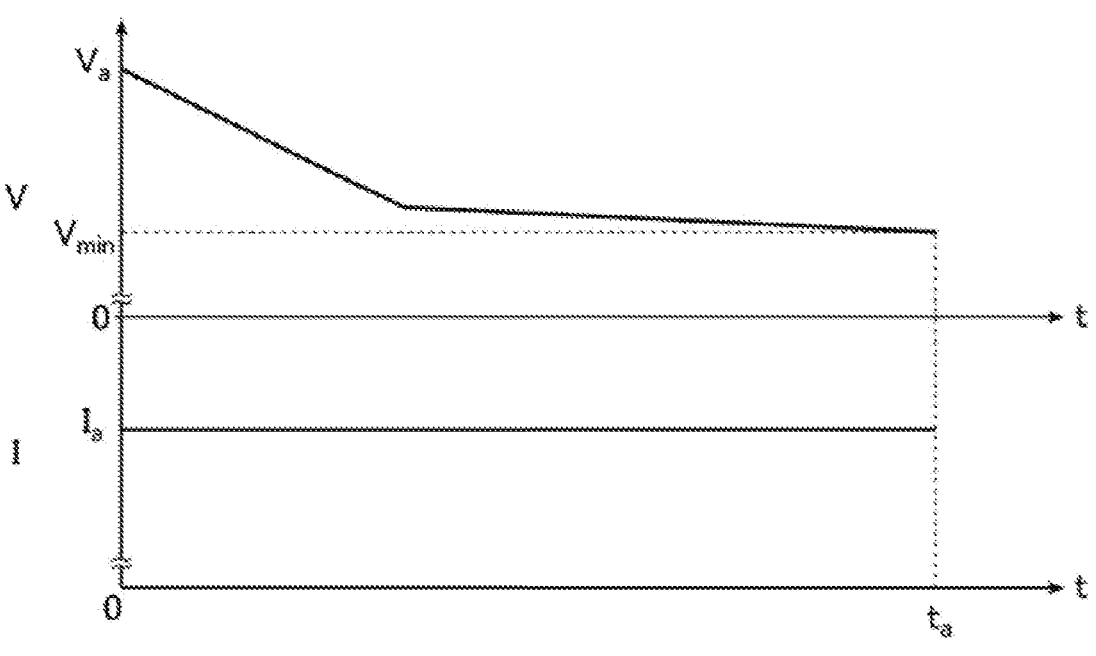
FIG. 5A is a graph illustrating that the voltage of the non-genuine battery can slowly decrease after the voltage is decreased, and illustrating an output value of the non-genuine battery.

For example, as illustrated by way of example in FIG. 5A, such non-genuine batteries 2 can involve a great decrease in the voltage V of the battery 2 followed by a gradual decrease in the voltage V, following which the voltage V is maintained to the lower limit voltage Vmin or higher until the predetermined period ta elapses. However, such a phenomenon does not occur or hardly occurs in the genuine battery 2.

Accordingly, the battery diagnosis apparatus 3 may diagnose that the battery 2 mounted on the electric vehicle 1 is not the normal product even in such a case where the non-genuine batteries 2 does not involve the decrease in the voltage V of the battery 2 to the lower limit voltage Vmin until the predetermined period ta elapses.

For example, the output value of the battery 2 during the period from the start of discharging until the elapse of the predetermined period ta may be used as a reference to determine whether the battery 2 mounted on the electric vehicle 1 is not the normal product in such a case where the non-genuine batteries 2 does not involve the decrease in the voltage V of the battery 2 to the lower limit voltage Vmin until the predetermined period ta elapses.

Figure 3B:
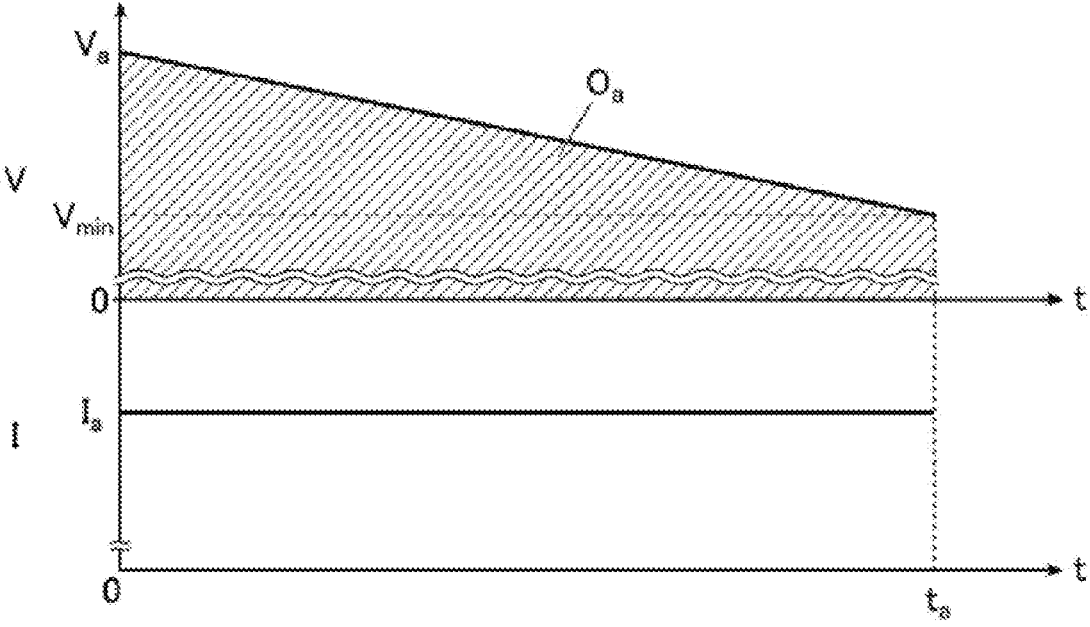
FIG. 3B is a graph illustrating that the voltage of the genuine battery decreases when discharging is started, and illustrating an initial value of the voltage and an output value of the battery.

The output value Oa from the genuine, new battery 2 may be expressed as the hatched area in FIG. 3B, based on the Expression (1) described above.

Figure 5B:
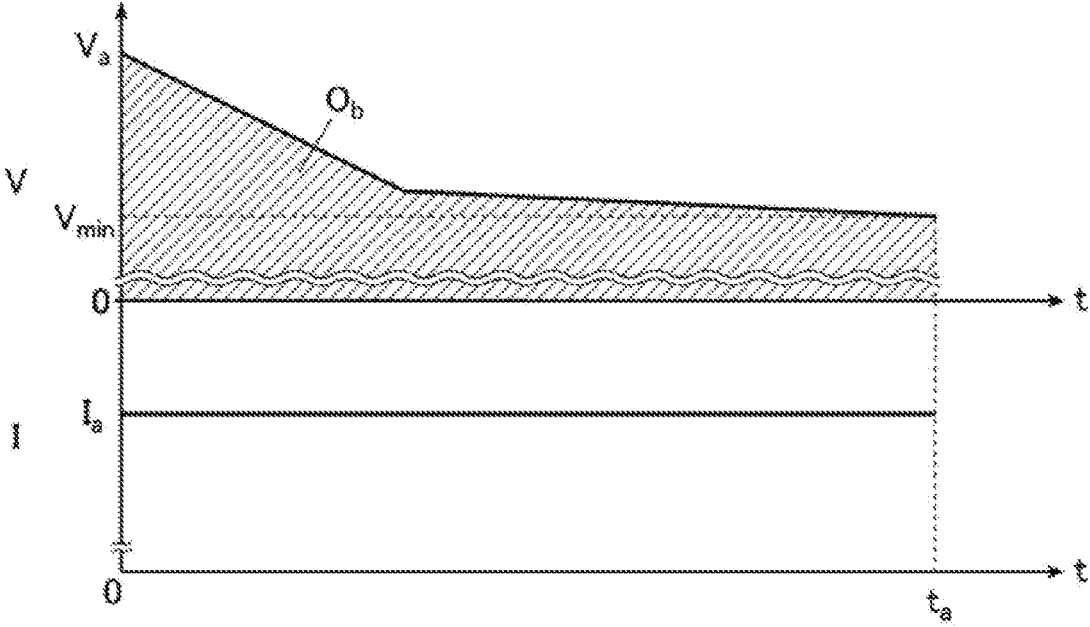
FIG. 5B is a graph illustrating that the voltage of the non-genuine battery can slowly decrease after the voltage is decreased, and illustrating the output value of the non-genuine battery.

Similarly, an output value Ob from the non-genuine battery 2 illustrated in FIG. 5A may be expressed as the hatched area in FIG. 5B, based on the Expression (1).

In some embodiments, the battery diagnosis apparatus 3 may calculate a ratio of the output value Ob of the battery 2 during the period from the start of discharging until the elapse of the predetermined time ta to the output value Oa to be outputted by the genuine, new battery during the predetermined time ta.

When the calculated ratio is equal to or less than a predetermined ratio, the battery diagnosis apparatus 3 may diagnose that the battery 2 may not possibly be the normal product. For example, the predetermined ratio may be 80%.

Accordingly, when the battery 2 is not the normal product, e.g., when the battery 2 is the non-genuine product or is the genuine product but is aged, a phenomenon occurs that is different from that of a case where the battery 2 is genuine and new when the discharging is performed from the battery 2 at the high output value Oa.

For example, if the battery 2 is the genuine, new product, the voltage V of the battery 2 may decrease from the predetermined initial value Va to the lower limit voltage Vmin or the voltage close to the lower limit voltage Vmin when the predetermined current value Ia is outputted from the battery 2 for the predetermined time ta.

In contrast, if the battery 2 is not the normal product, the voltage V of the battery 2 decreases to the lower limit voltage Vmin before the predetermined time ta elapses as illustrated in FIG. 4 when the predetermined current value Ia is outputted from the battery 2. Alternatively, the output value Ob from the battery 2 during the period from the start of discharging until the elapse of the predetermined time ta becomes equal to or less than the predetermined ratio of the output value Oa to be outputted from the genuine, new battery 2.

Accordingly, diagnosing whether the battery 2 satisfies any of the above conditions by discharging the battery 2 at the high output value Oa makes it possible to diagnose whether the battery 2 is the normal product.

In some embodiments, the BCU 3 may so perform control, as a control in a normal time, that an output current of the battery 2 gradually decreases when the voltage of the battery 2 approaches the lower limit voltage Vmin. Such a control may be referred to as a "second current limit control". The term "normal time" may refer to a time other than a time in which the diagnosis process is to be performed, such as a time of traveling or a time of normal use of the battery 2. The second current limit control helps to suppress the output of the battery 2 from reaching the lower limit voltage Vmin with the output of the battery 2 being high, and thereby suppress the output of the battery 2 from suddenly decreasing due to the output limit of the lower limit voltage Vmin.

When the second current limit control is to be performed in the normal time, the BCU 3 may cancel the second current limit control and execute the diagnosis process. In some embodiments, as the predetermined time ta of the diagnosis process, the predetermined time ta may be so set that the time of discharging elapses before the second current limit control is activated when the battery 2 is the genuine, new product. The diagnosis process in which the second current limit control is cancelled or the diagnosis process in which the predetermined time ta is set makes it easier for the BCU 3 to diagnose whether the battery 2 is the normal product.

The battery diagnosis apparatus 3 according to the example embodiment diagnoses that the battery 2 is not the normal product, when the voltage V decreases to the lower limit voltage Vmin before the predetermined time ta elapses from the start of discharging, from the battery 2, of the current having the predetermined current value Ia.

Alternatively, when the output value Ob from the battery 2 during the period from the start of discharging until the elapse of the predetermined time ta is equal to or less than the predetermined ratio of the output value Oa to be outputted from the genuine, new battery 2, the battery diagnosis apparatus 3 according to the example embodiment diagnoses that the battery 2 is not the normal product.

The battery diagnosis apparatus 3 according to the foregoing example embodiment diagnosed that the battery 2 is not the normal product when a phenomenon occurs that does not occur when the battery 2 is the genuine, new product, based on the output value O from the battery 2, the current I, or the voltage V Accordingly, the battery diagnosis apparatus 3 according to the example embodiment helps to diagnose whether the battery 2 is the normal product.

In addition, this configuration helps to diagnose whether the battery 2 is the normal product without performing an operation on the battery 2 mounted on the electric vehicle 1, such as removing the battery 2 from the electric vehicle 1 or opening a package of the battery 2.

Accordingly, the battery diagnosis apparatus 3 according to the example embodiment helps to diagnose whether the battery 2 is the normal product, with the battery 2 being mounted on the electric vehicle 1.

It should be noted that in an example case where the user knows that the battery 2 has been replaced with the non-genuine battery 2 by a dealer other than an authorized dealer, the user may possibly think it is not necessary to perform the diagnosis process by the battery diagnosis apparatus 3.

Accordingly, in some embodiments, the battery diagnosis apparatus 3 may perform the diagnosis process on the battery 2 when instructions to perform the diagnosis are given from the user.

In some embodiments, before starting the diagnosis process, the battery diagnosis apparatus 3 may seek for the user's intention by, for example, transmitting a signal asking whether to perform the diagnosis process to the portable terminal 10 (see FIG. 1) carried by the user.

In some embodiments, the battery diagnosis apparatus 3 may start the diagnosis process on the battery 2 when the instructions to perform the diagnosis process are given from the user. In some embodiments, the battery diagnosis apparatus 3 may refrain from performing the diagnosis process when the instructions to not perform the diagnosis process are given from the user.

When the limit on the output value is released as described above and a high voltage or a high current is discharged from the battery 2, the battery 2 can generate a heat abnormally if the battery 2 is the non-genuine product.

Accordingly, in some embodiments, the diagnosis process may be performed while confirming that a temperature of the battery 2 is not abnormally increased.

Although some example embodiments of the disclosure have been described in the foregoing by way of example with reference to the accompanying drawings, the disclosure is by no means limited to the embodiments described above. It should be appreciated that modifications and alterations may be made by persons skilled in the art without departing from the scope as defined by the appended claims. The disclosure is intended to include such modifications and alterations in so far as they fall within the scope of the appended claims or the equivalents thereof.

For example, the battery 2 may be a single battery or may include a plurality of batteries. In some embodiments, when the battery 2 includes the plurality of batteries, the diagnosis process may be discontinued when the temperature of at least one of the batteries is abnormally increased.

The BCU 3 illustrated in FIG. 1 is implementable by circuitry including at least one semiconductor integrated circuit such as at least one processor (e.g., a central processing unit (CPU)), at least one application specific integrated circuit (ASIC), and/or at least one field programmable gate array (FPGA). At least one processor is configurable, by reading instructions from at least one machine readable non-transitory tangible medium, to perform all or a part of functions of the BCU 3. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the nonvolatile memory may include a ROM and a NVRAM. The ASIC is an integrated circuit (IC) customized to perform, and the FPGA is an integrated circuit designed to be configured after manufacturing in order to perform, all or a part of the functions of the BCU 3 illustrated in FIG. 1.

The invention claimed is:

1. A battery diagnosis apparatus configured to perform a diagnosis process that determines whether a battery mounted on an electric vehicle is a normal product, the battery diagnosis apparatus comprising a battery control unit configured to:
   release a limit imposed on an output value from the battery and subject the battery to discharging at an output value that is higher than a predetermined value to perform the diagnosis process;
   cancel, during the diagnosis process, a current limit control in which an output current of the battery gradually decreases when a voltage of the battery approaches a lower limit voltage;
   perform the diagnosis process while confirming that a temperature of the battery is not abnormally increased; and
   diagnose that the battery is not the normal product when at least one of the following conditions is satisfied:
      a voltage of the battery decreases to the lower limit voltage before a predetermined time elapses from a start of discharging of a current having a predetermined current value from the battery; or an output value from the battery during a period from the start of the discharging until the elapse of the predetermined time is equal to or less than a predetermined ratio of an output value to be outputted from a genuine, new battery during the period from the start of the discharging until the elapse of the predetermined time.

2. The battery diagnosis apparatus according to claim 1, wherein the output value that is higher than the limit is set in advance to one of: an upper limit of an output value that falls within a range in which no malfunction occurs in one or more of devices of the electric vehicle, the one or more of devices being to be supplied with electric power from the battery; and an output value that is smaller than the upper limit.

3. The battery diagnosis apparatus according to claim 2, wherein, where the battery is the genuine, new battery, the predetermined time is set in advance as a time during which, when a current is discharged from the genuine, new battery at the predetermined current value, a voltage of the genuine, new battery decreases to a voltage closer to a lower limit voltage of the genuine, new battery than an intermediate voltage of the genuine, new battery.

4. The battery diagnosis apparatus according to claim 3, wherein the battery control unit is configured to perform the diagnosis process on the battery when an instruction to perform a diagnosis is given from a user of an electric vehicle.

5. The battery diagnosis apparatus according to claim 2, wherein the battery control unit is configured to perform the diagnosis process on the battery when an instruction to perform a diagnosis is given from a user of an electric vehicle.

6. The battery diagnosis apparatus according to claim 1, wherein the battery control unit is configured to perform the diagnosis process on the battery when an instruction to perform a diagnosis is given from a user of an electric vehicle.

7. The battery diagnosis apparatus according to claim 1, wherein the output value that is higher than the limit is set in advance to one of: an upper limit of an output value that falls within a range in which no malfunction occurs in one or more of devices of the electric vehicle, the one or more of devices being to be supplied with electric power from the battery; or an output value that is smaller than the upper limit.

8. A battery diagnosis apparatus configured to perform a diagnosis process that determines whether a battery mounted on an electric vehicle is a normal product, the battery diagnosis apparatus comprising circuitry configured to:

release a limit imposed on an output value from the battery and subject the battery to discharging at an output value that is higher than a predetermined value to perform the diagnosis process;

cancel, during the diagnosis process, a current limit control in which an output current of the battery gradually decreases when a voltage of the battery approaches a lower limit voltage;

perform the diagnosis process while confirming that a temperature of the battery is not abnormally increased; and diagnose that the battery is not the normal product when at least one of the following conditions is satisfied:

a voltage of the battery decreases to the lower limit voltage before a predetermined time elapses from a start of discharging of a current having a predetermined current value from the battery; or an output value from the battery during a period from the start of the discharging until the elapse of the predetermined time is equal to or less than a predetermined ratio of an output value to be outputted from a genuine, new battery during the period from the start of the discharging until the elapse of the predetermined time.

* * * * *